United States Patent [19]
Kim et al.

[11] Patent Number: 6,123,805
[45] Date of Patent: Sep. 26, 2000

[54] DISCHARGE ELECTRODE AND PROCESS CHAMBER OF DRY ETCHING FACILITY FOR MANUFACTURING SEMICONDUCTOR DEVICES

[75] Inventors: Tae-hoon Kim; Byung-chul Kim; Dong-hwan Ko, all of Kyungki-do, Rep. of Korea

[73] Assignee: Samsung Electronics Co., Ltd., Suwon, Rep. of Korea

[21] Appl. No.: 09/401,960

[22] Filed: Sep. 22, 1999

[30] Foreign Application Priority Data

Oct. 1, 1998 [KR] Rep. of Korea ................. 98-41441

[51] Int. Cl.[7] ................. C23C 16/00; H05H 1/00
[52] U.S. Cl. ................. 156/345; 118/723 E; 118/728
[58] Field of Search ................. 118/723 E, 728, 118/725; 156/345

[56] References Cited

U.S. PATENT DOCUMENTS

| | | | |
|---|---|---|---|
| 5,460,684 | 10/1995 | Saeki et al. | 118/723 E |
| 5,529,657 | 6/1996 | Ishii | 118/723 E |
| 5,605,637 | 2/1997 | Shan et al. | 118/723 E |

*Primary Examiner*—Shrive Beck
*Assistant Examiner*—Parviz Hassanzadeh
*Attorney, Agent, or Firm*—Jones Volentine, LLC

[57] ABSTRACT

A process chamber of a dry etching facility for manufacturing semiconductor devices uniformly forms the ion density of plasma over a wafer, and reduces the volume of the process chamber by installing a plurality of discharge openings in an electrode housing which supports the electrode plate of a lower electrode. The lower electrode is a discharge electrode which is constructed such that a plurality of discharge openings are symmetrically provided in the side wall of the electrode housing supporting the electrode plate on which a wafer is mounted, and the discharge openings form a discharge passage which is connected to a discharge pipe at a pipe connection opening.

22 Claims, 5 Drawing Sheets

DISCHARGE ELECTRODE AND PROCESS CHAMBER OF DRY ETCHING FACILITY FOR MANUFACTURING SEMICONDUCTOR DEVICES

BACKGROUND OF THE INVENTION

1. Field of the Invention

The present invention relates to a discharge electrode and a process chamber of a dry etching facility for manufacturing semiconductor devices for uniformly forming the ion density of plasma over a wafer, and reducing the volume of the process chamber by installing a plurality of discharge openings on an electrode housing comprising the electrode, thereby uniformly forming an ion density on a wafer.

2. Background of the Related Art

A photolithography process of a semiconductor device fabrication process is performed by coating photoresist on a wafer and performing an etch process after forming a pattern.

The etch process may be a wet method using chemicals or a dry method using gas. Also, the etch process may be a whole etch, in which the entire photoresist layer is removed from the wafer, or etching may be carried out using portions of the photoresist as a mask.

The etch process is primarily a chemical reaction to which physical factors such as sputtering are added. Etching was one of the early surface treatment methods, and developed from etching silicon, etc., to selective etch technologies for an oxide silicon layer, and then to the development of etch technologies for an aluminum layer to form an electrode.

Recently, wet etch for digestion etch, eminent etch, or spray etch, etc., have been replaced by a dry etch. The dry etch process is advantageous in that it avoids treatment for waste water, instability of etch solution after preparation, difficulties with isotropic etch, and nonuniform pattern etches caused by air bubbles, etc. Dry etches are widely used and comprise, for example, gas etch, plasma etch, sputtering etch and ion beam etch.

Plasma etching is shown in FIGS. 1 and 2 using a conventional dry etch apparatus. The apparatus is constructed such that two electrodes, upper electrode 1 and lower electrode 2, are placed facing each other, and upper electrode 1 functions as a cover for the process chamber. In addition, the upper electrode 1 has a surface which is the same width or wider than the lower electrode 2. There is a wafer 5 placed between the upper electrode 1 and the lower electrode 2. High frequency power is supplied between the upper electrode 1 and the lower electrode 2. In addition, a process gas is supplied over the wafer 5 so as to perform the etch process. The reacted process gas and other by-products are discharged through a discharge pipe 4 connected to a vacuum pump (not shown). An insulator 3 is provided between the upper electrode 1 and the discharge pipe 4 to minimize the effect of high frequency power. Normally, the discharge pipe 4 is made of an insulator material.

In addition, the inlet of the discharge pipe 4 is placed lower than the wafer 5 to easily discharge any powder generated as by-products of the reaction. The discharge pipe 4 is connected to a vacuum pump, and functions to evacuate the inside of the process chamber.

However, as shown in FIGS. 1 and 2, since the discharge pipe 4 is placed adjacent to lower electrode 2 on which the wafer 5 is placed, a nonuniform ion density plasma results on the wafer 5 due to the size and location of the discharge pipe 4. Accordingly, the etch process is nonuniform. In addition, since the open discharge pipe 4 is located next to where the etch process is carried out, the volume of the process chamber is increased by the volume of the discharge pipe. In addition, this location of the discharge pipe makes the entire dry etch facility larger, which means it occupies more space in the clean room, and lowers the efficiency of the clean room, particularly in the case of large-diameter wafers.

SUMMARY OF THE INVENTION

The present invention is directed to providing a process chamber of a dry etching facility for manufacturing semiconductor devices for uniformly forming the ion density of plasma over a wafer, and for reducing the volume of the process chamber by symmetrically and integrally installing a plurality of discharge openings on an electrode housing comprising the electrode.

To achieve this and other advantages, the discharge electrode of the present invention is constructed such that a plurality of discharge openings are symmetrically formed in a side wall of the electrode housing, the discharge openings forming a discharge passage extending from the side wall, through the electrode housing, and ending at a pipe connection opening formed at a lower end of the electrical housing.

In addition, the present invention provides for a process chamber incorporating the above-described discharge electrode. More specifically, the process chamber includes an upper electrode forming a cover enclosing the process chamber and a lower electrode facing the upper electrode. The lower electrode serves as a discharge electrode, and the lower electrode includes an electrode housing supporting an electrode plate on which a wafer is mounted. A plurality of discharge openings are symmetrically formed in a side wall of the electrode housing, the discharge openings forming a discharge passage extending from the side wall, through the electrode housing, and ending at a pipe connection opening formed at a lower end of the electrical housing, which is connected to a discharge pipe.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention in which:

FIG. 1 schematically shows one embodiment of a conventional process chamber of a dry etch apparatus for manufacturing semiconductor devices including a discharge electrode;

FIG. 2 shows another embodiment of a conventional process chamber of a dry etch apparatus for manufacturing semiconductor devices;

FIG. 3 schematically shows a discharge electrode for a dry etch apparatus according to one embodiment of the present invention;

FIG. 4 schematically shows a process chamber of a dry etch apparatus for manufacturing semiconductor devices including the discharge electrode of FIG. 3;

DETAILED DESCRIPTION OF PREFERRED EMBODIMENTS

Preferred embodiments of the present invention will now be described in detail with reference to the accompanying drawings.

Figure 3:
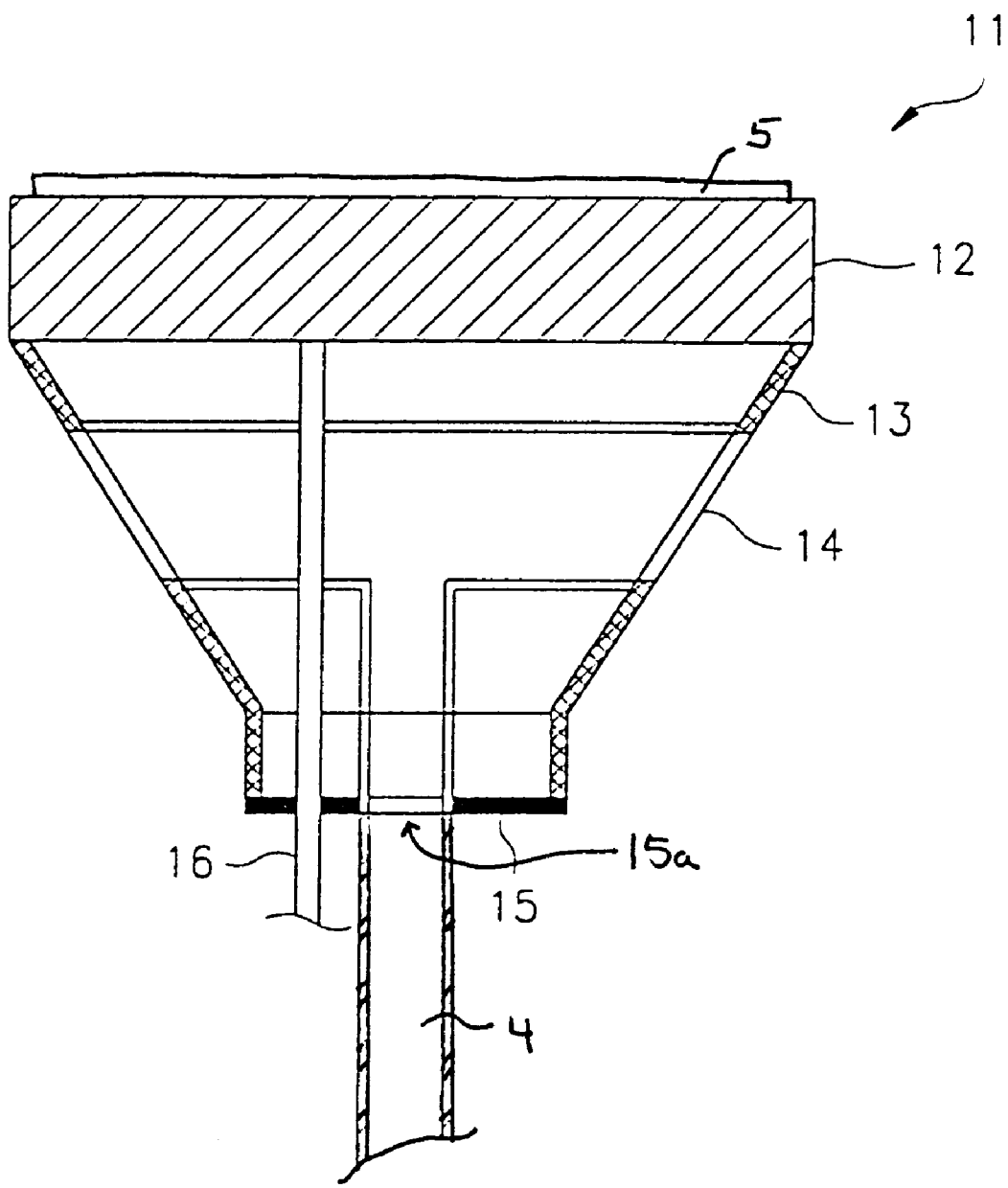

As shown in FIG. 3, the discharge electrode of a dry etch apparatus of the present invention includes an electrode plate 12 placed on the upper end of an electrode housing 13. In the side wall of the electrode housing 13, there are a plurality of symmetrically formed discharge openings 14 extending therethrough in directions radially of a vertically extending central longitudinal axis of the side wall. The discharge openings 14 form a discharge passage extending from the side wall, through the electrode housing 13, and ending at a pipe connection opening 15a formed at a lower end of the electrical housing. A discharge pipe 4 is connected to the lower end of the electrode housing 13 and is in flow communication with the pipe connection opening 15a. The discharge openings, discharge passage and discharge pipe form a passage for discharging a process gas from the process chamber. Since the plurality of discharge openings 14 are symmetrically formed on the side wall of the electrode housing 13 supporting the electrode plate 12, plasma having a constant ion density is formed on the electrode plate 12, and thereby, the wafer 5 placed on the electrode plate 12 is uniformly etched. The formation of plasma also depends on the density of the process gas, and the distribution of high frequency power applied for ionization of the process gas.

Figure 4:
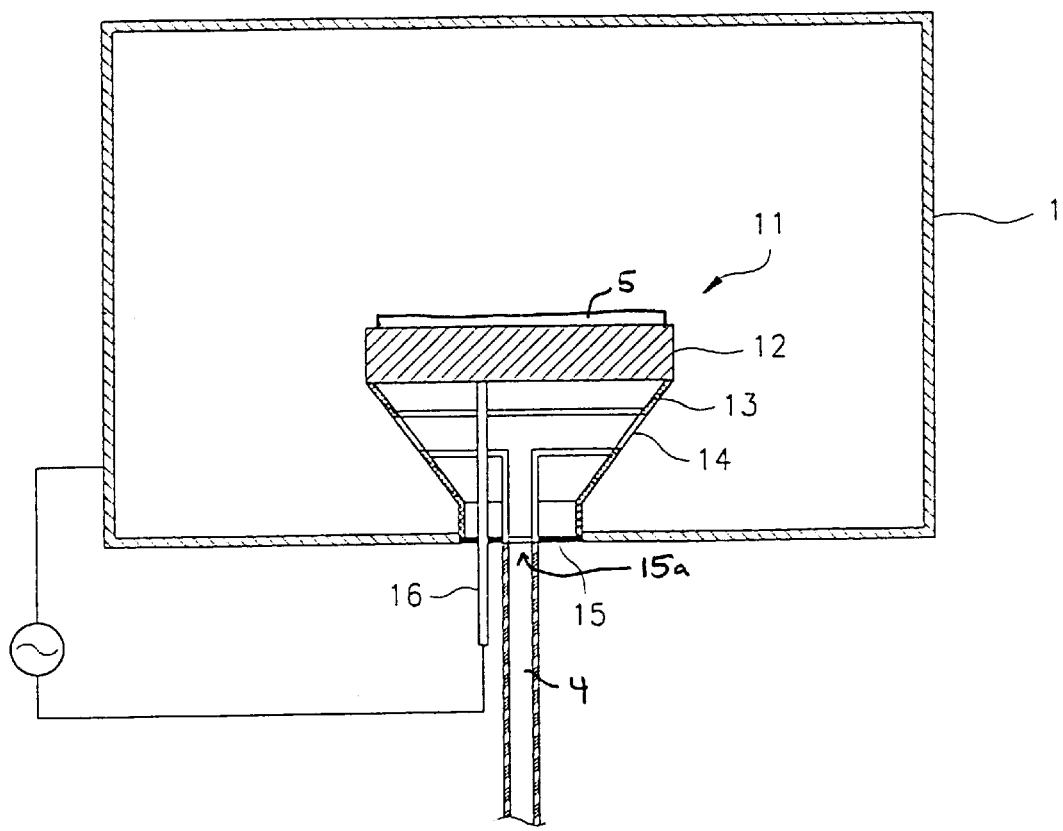

As shown in FIG. 4, the enclosure comprising the the upper electrode 1 defines the interior processing space of the process chamber. The electrode plate 12 supports the wafer 5 in the same way as the conventional lower electrode 2, and ionizes the process gas supplied into the interior process space with applied high frequency power so as to form plasma. Since high frequency power is applied on the electrode plate 12, it should be made of a conductive material. The electrode housing 13 supporting the electrode plate 12 can be made of either an electrically conductive material or an insulator material.

The discharge openings 14 formed in the side wall of the electrode housing 13 are formed in such a manner that there are at least two, they are located symmetrically around the electrode housing 13, and they form a discharge passage which discharges process gas and reaction by-products to the discharge pipe 4. More specifically, the electrode housing 13 extends vertically from the electrode plate 12 to a location extending around the pipe connection opening 15a at the bottom of the discharge electrode 11 so as to form a tubular side wall of the discharge electrode 11.

When the electrode housing 13 is formed from non-conductive material, high-frequency power is applied to the electrode plate 12 formed on the upper end of the electrode housing 13 by a high frequency supply rod 16 that passes through the electrode housing and is connected to a lower surface of the electrode plate 12.

In summary, the discharge electrode 11 having the structure as above is constructed such that a plurality of discharge openings 14 are symmetrically formed with respect to the electrode plate 12 on which the wafer 5 is placed, and the process gas supplied on the electrode plate 12 is uniformly formed.

Figure 5:
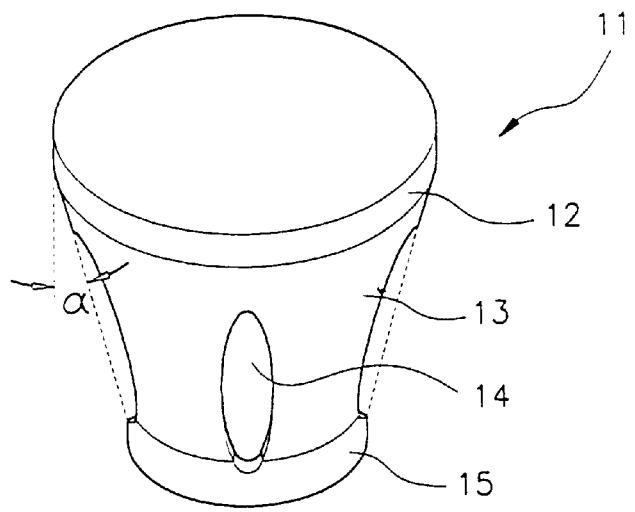
FIG. 5 is a perspective view showing another embodiment of the discharge electrode of the present invention.

In addition, the discharge electrode 11, as shown in FIG. 5, is preferably formed such that the upper end, on which the electrode plate 12 is placed, is wider than the lower end comprising pipe connector 15 which is connected to the discharge pipe, so that the size of the electrode plate 12 on which the wafer 5 is placed can be easily controlled according to the diameter of the wafer 5.

The inclined angle ($\alpha$) of discharge electrode 11 of an adverse-inclined type is in a range of 1 to 89°, preferably 10 to 40°. As shown in FIG. 5, the angle ($\alpha$) of the discharge electrode 11 is measured between a vertical reference and a line extending from the upper end to the lower end of the discharge electrode. When the inclined angle ($\alpha$) is less than 10°, the inclination is so slight that there is little difference between the diameter of the upper end on which the electrode plate 12 is placed, and the diameter of the lower end comprising pipe connector 15 connected to discharge pipe 4. When the inclined angle ($\alpha$) is greater than 40°, the inclination is so abrupt that the discharged air flow has difficulty being discharged because of the formation of a vortex flow on the edge of the process chamber and near the bottom of the process chamber. In addition, if the diameter at the lower end of the electrode housing 13 becomes to small, the discharge pipe 4 will be too narrow.

Figure 6:
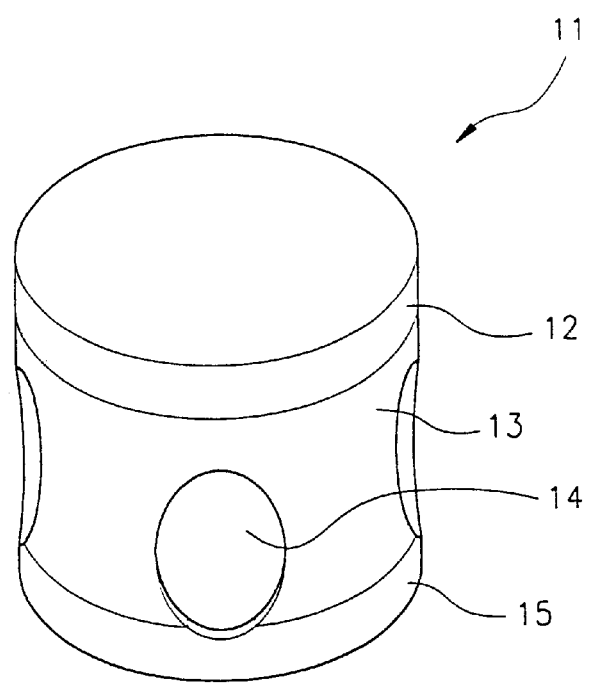
FIG. 6 is a perspective view showing a further embodiment of the discharge electrode of the present invention.

Alternatively, as shown in FIG. 6, the discharge electrode 11 may be formed as a vertical-type discharge electrode 11 wherein the upper end, on which the electrode plate 12 is placed, and the lower end, connected to the discharge pipe 4, have the same diameter.

Figure 7:
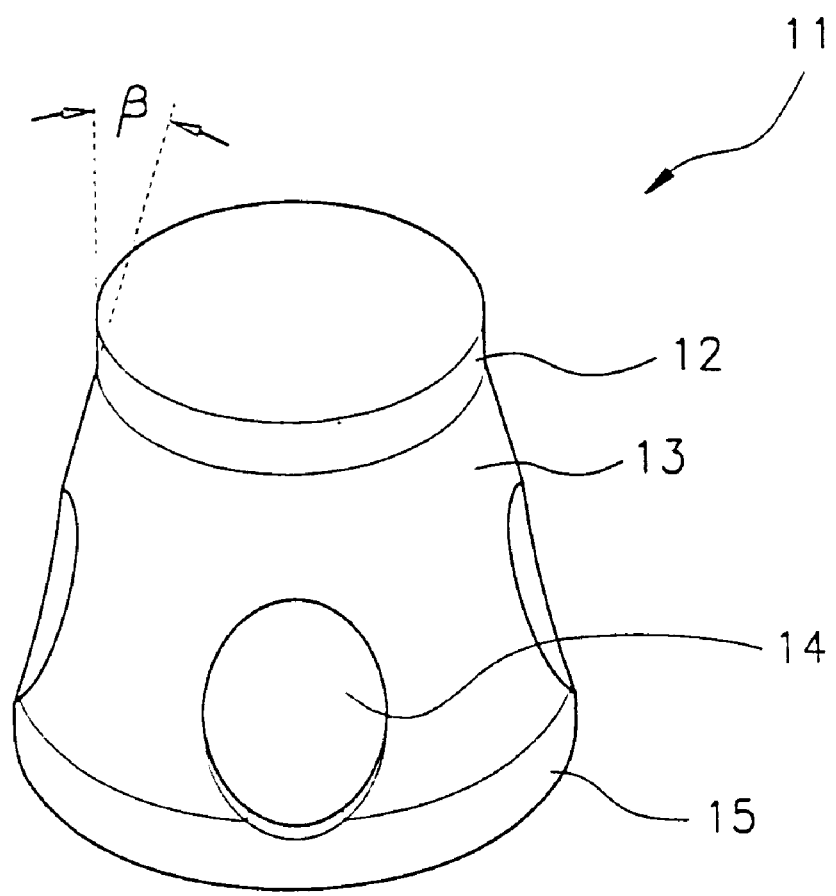
FIG. 7 is a perspective view showing still another embodiment of the discharge electrode of the present invention.

In another embodiment, as shown in FIG. 7, the discharge electrode 11 can be formed as an inclined-type discharge electrode 11 in which the upper end is narrower than the lower end, the electrode 12 being placed on the upper end, and the discharge pipe 4 being connected to the lower end by pipe connector 15. The inclined angle ($\beta$) of the inclined-type discharge electrode 11 is in a range of 1 to 89°, preferably 10 to 40°. As shown in FIG. 7, the angle ($\beta$) of the discharge electrode 11 is measured between a vertical reference and a line extending from the lower end to the upper end of the discharge electrode. When the inclined angle ($\beta$) is less than 10°, the inclination is so slight that there is little difference between the diameter of the upper and lower ends of the discharge electrode 11. On the contrary, when the inclined angle ($\beta$) is greater than 40°, the inclination is so abrupt that the upper end on which the electrode plate 12 is placed is too narrow.

A process chamber of a dry etch apparatus for manufacturing semiconductor devices according to the present invention, as shown in FIG. 4, is constructed such that the lower electrode comprises discharge electrode 11 having a plurality of discharge openings 14 symmetrically provided in the side wall of the electrode housing 13 supporting the electrode plate 12 on which a wafer 5 is placed. The discharge openings 14 lead to pipe connection opening 15a, which is in flow communication with the discharge pipe 4, and the discharge pipe 4 is connected to the electrode housing 13 via the pipe connector 15. An upper electrode 1 is disposed opposite discharge electrode 11.

Therefore, the process chamber according to the present invention is constructed such that the electrode plate 12 functioning as an electrode, and the discharge openings 14 connected with the discharge pipe 4, are integrally provided on the electrode housing 13, as compared to the conventional process chamber in which a discharge pipe 4 and an electrode are separately provided. By providing a discharge electrode 11, in which only the electrode plate 12 is proportional to the area of the wafer 5, the electrode and discharge pipe functions can be performed together so as to minimize the area of the process chamber inside a clean room. Since the discharge openings 14 are symmetrically provided on the electrode housing 13, and are uniformly centered under the wafer 5, the ion density of the plasma applied on the wafer 5 can be uniformly provided. Uniform process conditions can therefore be applied on the whole surface of the wafer 5. In addition, since the discharge openings 14 are placed under the wafer 5 on which the process is applied, particles generated as by-products during the etch process can be easily discharged out of the process chamber without creating a vortex flow phenomenon.

The electrode plate 12 of the discharge electrode 11 is placed opposite to the upper electrode 1, and accordingly, when high frequency power is applied between the electrode plate 12 and the upper electrode 1, process gas introduced between them becomes a plasma, and thereby, the wafer 5 placed on the electrode plate 12 is affected by the plasma, and a process such as dry etch is applied on the wafer 5.

The electrode plate 12 can be made the same size or a little larger than the wafer 5 placed thereon, but preferably has a similar size to the wafer 5. An electrode plate 12 having a smaller size than the upper electrode 1 is good for ensuring a uniform process. As stated previously, the electrode plate 12 can be connected to a high frequency power source by employing high frequency supply rod 16 as an electrically positive conductor to apply high frequency power when the electrode housing 13 is made of an insulator which is electrically non-conductive.

Preferably, at least two discharge openings 14 are formed in the electrode housing 13. If only one discharge opening 14 is provided, the flow of the discharged gas is nonuniform, and the process on the wafer 5 is non-uniformly performed. Preferably, the discharge openings 14 form a discharge passage extending at one end from an outside surface of the electrode housing 13 to a second end connected to the upper end of the discharge pipe 4, with the second end of the discharge opening 14 located at the lower end of the process chamber, in order to facilitate easy discharge of the hardened particles produced as reaction by-products.

The electrode housing 13 is preferably formed as an electrically non-conductive insulator, for insulation when high frequency power is applied between the upper electrode 1 and the electrode plate 12.

The upper electrode 1 and the discharge pipe 4 of FIGS. 3 and 4 are structurally and functionally similar to the upper electrode 1 and the discharge pipe 4 of the process chamber of the conventional dry etch apparatus.

Figure 1:
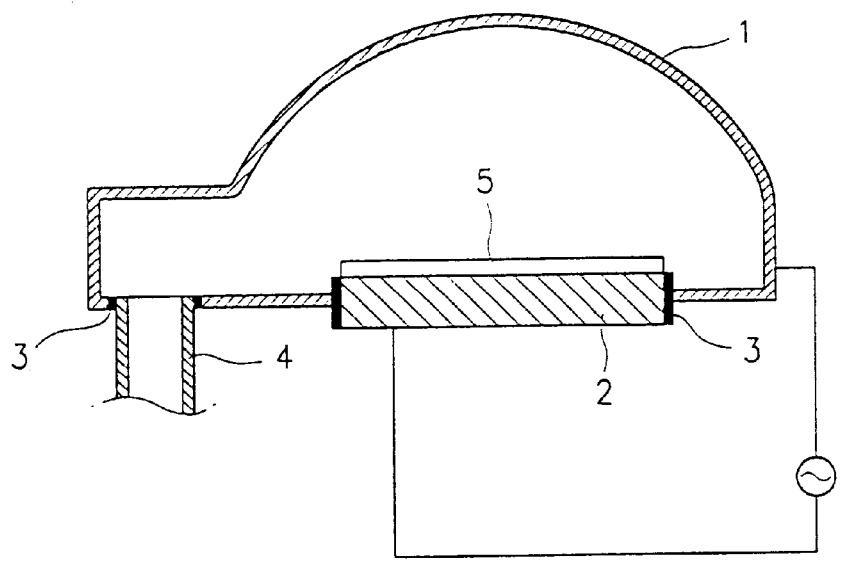
Figure 2:
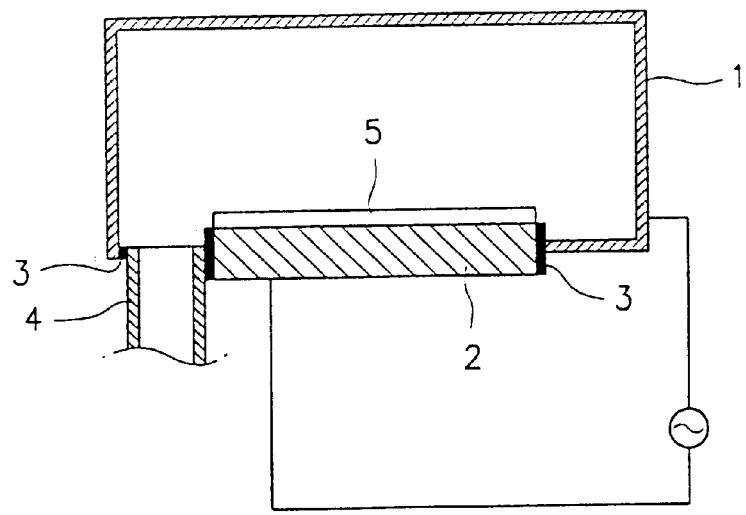

An insulator 3 as shown in FIGS. 1 and 2 can be placed between the discharge electrode 11 and the upper electrode 1, and can be made large so as to function as a cover of the process chamber, instead of the upper electrode 1 serving as the cover as shown in FIG. 4. The inside of the process chamber is sealed to the outside, and the inside of the process chamber is evacuated to a vacuum state. In addition, a vacuum facility, a pressure reducing valve and a pressure controller (not shown) can be provided on the discharge pipe 4 to form the vacuum inside the process chamber, and control the pressure reduction. The above vacuum facility, the pressure reducing valve, and the pressure controller are well-known to one of skill in the art and commercially and widely known.

Therefore, according to the present invention, a plurality of discharge openings 14 are symmetrically provided about the electrode plate 12 on which the wafer 5 is placed so that the flow of the process gas flowed onto the electrode plate 12 is uniform, and the ion density of the plasma formed thereby is uniform. As a result, the etch process for the wafer can be performed uniformly, and the production yield and the reliability for the semiconductor wafers can be increased. In addition, by integrating the function of the discharge pipe 4 and the electrode into one discharge electrode 11, the volume of the process chamber can be reduced, and the efficiency of the clean room can be increased, particularly in the case of a large-diameter wafer.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A discharge electrode for a dry etch apparatus, comprising:

an electrode plate on which a wafer is to be mounted, said electrode plate being disposed at and thereby forming the top of the discharge electrode;

an electrode housing supporting said electrode plate;

a pipe connection opening through which process gas is to be discharged from the discharge electrode, said pipe connection opening being located at the bottom of the discharge electrode;

said electrode housing extending vertically downward from said electrode plate to a location at the bottom of the discharge electrode so as to form a tubular side wall of the discharge electrode having a vertically extending central longitudinal axis, said pipe connection opening being disposed radially inwardly of said tubular side wall at the bottom of the discharge electrode, and said tubular side wall having a plurality of discharge openings extending therethrough in directions radially of said longitudinal axis and which discharge openings are formed symmetrically with respect to said electrode plate supported by said electrode housing, the discharge openings forming a discharge passage extending through the electrode housing and in open flow communication with said pipe connection opening located at the bottom of the discharge electrode, whereby process gases will discharge uniformly about a wafer supported on the electrode plate, through said discharge openings and out said pipe connection opening when the discharge electrode is used to carry out a dry etch process.

2. The discharge electrode for the dry etch apparatus of claim 1, wherein the electrode housing supporting the electrode plate is electrically conductive.

3. The discharge electrode for the dry etch apparatus of claim 1, wherein the electrode housing supporting the electrode plate is an insulator.

4. The discharge electrode for the dry etch apparatus of claim 3, further comprising a high frequency power rod passing through the electrical housing and connected to a lower surface of the electrode plate.

5. The discharge electrode for the dry etch apparatus of claim 1, wherein the top of the discharge electrode, at which the electrode plate is supported, is wider than the bottom of the discharge electrode, at which the pipe connection opening is located, whereby said electrode housing tapers at a predetermined angle, relative to a vertical reference, from said electrode plate toward said pipe connection opening.

6. The discharge electrode for the dry etch apparatus of claim 5, wherein said predetermined angle is within a range of 1 to 89°.

7. The discharge electrode for the dry etch apparatus of claim 6, wherein said predetermined angle is within a range of 10 to 40°.

8. The discharge electrode for the dry etch apparatus of claim 1, wherein the top of the discharge electrode, at which the electrode plate is supported, and the bottom of the discharge electrode, at which the pipe connection opening is located, have the same diameter.

9. The discharge electrode for the dry etch apparatus of claim 1, wherein the top of the discharge electrode, at which the electrode plate is located, is narrower than the bottom of the discharge electrode, at which the pipe connection opening is located, whereby said electrode housing tapers at a predetermined angle, relative to a vertical reference, as taken from said connection opening toward said electrode plate.

10. The discharge electrode for the dry etch apparatus of claim 9, wherein said predetermined angle is within a range of 1 to 89°.

11. The discharge electrode for the dry etch apparatus of claim 10, wherein said predetermined angle is within a range of 10 to 40°.

12. A process chamber of a dry etch apparatus for manufacturing semiconductor devices, comprising:
   an upper electrode;
   an enclosure delimiting an interior processing space of the process chamber, wherein said upper electrode forms a cover of the process chamber; and
   a lower electrode facing the upper electrode, the lower electrode serving as a discharge electrode and comprising an electrode plate on which a wafer is to be mounted, said electrode plate being disposed at and thereby forming the top of the discharge electrode, a pipe connection opening through which process gas is discharged out of the processing space, and an electrode housing supporting said electrode plate and extending downwardly therefrom to a location at the bottom of the discharge electrode so as to form a tubular side wall of the discharge electrode having a vertically extending central longitudinal axis, said pipe connection opening being disposed radially inwardly of said tubular side wall at the bottom of the discharge electrode, and said tubular side wall having a plurality of discharge openings extending therethrough in directions radially of said longitudinal axis and which discharge openings are formed symmetrically with respect to said electrode plate supported by said electrode housing, the discharge openings forming a discharge passage extending through the electrode housing and in open flow communication with said annular region of said interior processing space and said pipe connection opening located at the bottom of the discharge electrode, whereby process gases will discharge from said interior processing space uniformly about a wafer supported on the electrode plate, through said discharge openings and out said pipe connection opening when the discharge electrode is used to carry out a dry etch process.

13. The process chamber of the dry etch apparatus for manufacturing semiconductor devices of claim 12, wherein the electrode housing supporting the electrode plate is electrically conductive.

14. The process chamber of the dry etch apparatus for manufacturing semiconductor devices of claim 12, wherein the electrode housing supporting the electrode plate is an insulator.

15. The process chamber of the dry etch apparatus for manufacturing semiconductor devices of claim 14, further comprising a high frequency power rod passing through the electrical housing and connected to a lower surface of the electrode plate.

16. The process chamber of the dry etch apparatus for manufacturing semiconductor devices of claim 12, wherein the top of the discharge electrode, at which the electrode plate is supported, is wider than the bottom of the discharge electrode, at which the pipe connection opening is located, whereby said electrode housing tapers at a predetermined angle, relative to a vertical reference, from said electrode plate toward said pipe connection opening.

17. The process chamber of the dry etch apparatus for manufacturing semiconductor devices of claim 16, wherein said predetermined angle is within a range of 1 to 89°.

18. The process chamber of the dry etch apparatus for manufacturing semiconductor devices of claim 17, wherein said predetermined angle is within a range of 10 to 40°.

19. The process chamber of the dry etch apparatus for manufacturing semiconductor devices of claim 12, wherein the top of the discharge electrode, at which the electrode plate is supported, and the bottom of the discharge electrode, at which the pipe connection opening is located, have the same diameter.

20. The process chamber of the dry etch apparatus for manufacturing semiconductor devices of claim 12, wherein the top of the discharge electrode, at which the electrode plate is located, is narrower than the bottom of the discharge electrode, at which the pipe connection opening is located, whereby said electrode housing tapers at a predetermined angle, relative to a vertical reference, as taken from said pipe connection opening toward said electrode plate.

21. The process chamber of the dry etch apparatus for manufacturing semiconductor devices of claim 20, wherein said predetermined angle is within a range of 1 to 89°.

22. The process chamber of the dry etch apparatus for manufacturing semiconductor devices of claim 21, wherein said predetermined angle is within a range of 10 to 40°.

* * * * *